(12) United States Patent
Konti

(10) Patent No.: US 11,461,988 B2
(45) Date of Patent: Oct. 4, 2022

(54) METHOD OF TRANSFERRING DATA BETWEEN UNCONNECTED COMPUTING DEVICES

(71) Applicant: Suresh Babu Revoled Konti, Lewis Center, OH (US)

(72) Inventor: Suresh Babu Revoled Konti, Lewis Center, OH (US)

( * ) Notice: Subject to any disclaimer, the term of this patent is extended or adjusted under 35 U.S.C. 154(b) by 105 days.

(21) Appl. No.: 17/076,253

(22) Filed: Oct. 21, 2020

(65) Prior Publication Data

US 2022/0027689 A1    Jan. 27, 2022

Related U.S. Application Data

(60) Provisional application No. 63/055,555, filed on Jul. 23, 2020.

(51) Int. Cl.
*G06V 10/10*       (2022.01)
*G06F 3/14*        (2006.01)
*H04N 5/232*       (2006.01)
*H03M 7/30*        (2006.01)
*G06V 30/10*       (2022.01)

(52) U.S. Cl.
CPC ............... *G06V 10/10* (2022.01); *G06F 3/14* (2013.01); *H04N 5/23229* (2013.01); *G06V 30/10* (2022.01); *G06V 2201/02* (2022.01); *H03M 7/70* (2013.01)

(58) Field of Classification Search
CPC .... G06V 10/10; G06V 30/10; G06V 2201/02; G06V 10/82; G06V 20/62; G06V 10/225; G06V 2201/10; G06V 30/153; G06V 30/412; G06V 10/23; G06V 10/255; G06V 10/42; G06V 10/44; G06F 3/14; H04N 5/23229; H03M 7/70; G09G 5/00; G06K 7/10881; G06K 9/6271; G06K 2007/10524; G06K 7/10722; G06K 7/10732; G06K 7/14; G06K 7/1417; G06K 7/1443; G06K 9/6262; G06K 9/6263; G06K 19/06037; G06N 3/0454; G06N 3/0445

See application file for complete search history.

(56) References Cited

U.S. PATENT DOCUMENTS

| 9,141,503 | B1 * | 9/2015 | Chen | G06F 11/22 |
| 9,514,376 | B2 * | 12/2016 | Cuthbert | G06V 10/95 |
| 9,679,176 | B2 * | 6/2017 | Liu | G06K 7/10732 |
| 9,952,858 | B2 * | 4/2018 | Walker | G06N 20/00 |
| 10,366,315 | B1 * | 7/2019 | Kumar | G06F 16/93 |
| 10,482,182 | B1 * | 11/2019 | Jankowski, Jr. | G10L 15/22 |

(Continued)

*Primary Examiner* — Michael S Osinski
(74) *Attorney, Agent, or Firm* — Barry Choobin; Patent 360

(57) ABSTRACT

The present invention is directed to a method of transferring a chunk of data between unconnected computing devices. A first chunk of data present in a source computing device can be in a first format that is binary data or nonstandard characters. Encoding, by the source computing device, the first chunk of data to a second chunk of data. The second chunk of data is in a format that is of standard characters. Capturing an image of the second chunk of data by an optical sensor. Receiving of the image by the target computing device. Processing of the image, by the target computing device, to the second chunk of data. Decoding, by the target computing device, the secondary chunk of data to the first chunk of data.

6 Claims, 6 Drawing Sheets

(56) References Cited

U.S. PATENT DOCUMENTS

| | | | |
|---|---|---|---|
| 10,719,258 B2* | 7/2020 | Sheng | G06F 3/0652 |
| 11,068,715 B1* | 7/2021 | Zuo | G06V 20/20 |
| 2005/0286779 A1* | 12/2005 | Sasaki | H04N 1/3871 |
| | | | 382/232 |
| 2006/0043186 A1* | 3/2006 | Nadabar | G06K 7/14 |
| | | | 235/462.1 |
| 2012/0091205 A1* | 4/2012 | Khorsheed | G06K 7/14 |
| | | | 235/462.11 |
| 2012/0138684 A1* | 6/2012 | Van Volkinburg | |
| | | | G06K 7/10386 |
| | | | 235/455 |
| 2012/0193416 A1* | 8/2012 | Smith | G06K 7/1491 |
| | | | 235/440 |
| 2012/0193429 A1* | 8/2012 | Van Volkinburg | |
| | | | G06K 7/10811 |
| | | | 235/470 |
| 2012/0218275 A1* | 8/2012 | Wu | G06F 21/6209 |
| | | | 382/232 |
| 2014/0217180 A1* | 8/2014 | Liu | E05B 73/0005 |
| | | | 235/472.01 |
| 2015/0278620 A1* | 10/2015 | Fujita | H04N 19/44 |
| | | | 382/182 |
| 2016/0034644 A1* | 2/2016 | Guiney | G16H 10/60 |
| | | | 705/3 |
| 2017/0287018 A1* | 10/2017 | Narasimhan | G06F 21/32 |
| 2017/0308551 A1* | 10/2017 | Nomura | H04N 1/00244 |
| 2017/0364744 A1* | 12/2017 | Savchenkov | G06K 9/6263 |
| 2018/0026980 A1* | 1/2018 | Lee | G06K 7/1417 |
| | | | 713/168 |
| 2018/0227274 A1* | 8/2018 | Xian | H04L 9/38 |
| 2018/0302379 A1* | 10/2018 | Zhou | G06F 21/606 |
| 2019/0220971 A1* | 7/2019 | Weaver | G06T 7/0004 |
| 2019/0266447 A1* | 8/2019 | Collet | G06V 10/40 |
| 2020/0026766 A1* | 1/2020 | Ji | G06V 30/158 |
| 2020/0026951 A1* | 1/2020 | Chowdhury | G06V 10/82 |
| 2020/0065537 A1* | 2/2020 | He | G06V 10/10 |
| 2020/0394431 A1* | 12/2020 | Ramachandra Iyer | |
| | | | G06F 40/58 |
| 2021/0081729 A1* | 3/2021 | Huang | G06F 40/30 |
| 2021/0125034 A1* | 4/2021 | Nguyen | G06V 10/454 |
| 2021/0150169 A1* | 5/2021 | Liu | G06Q 20/401 |
| 2021/0209356 A1* | 7/2021 | Wang | G06F 40/279 |
| 2021/0232843 A1* | 7/2021 | Xu | G06V 40/70 |
| 2021/0248406 A1* | 8/2021 | Feng | H04H 60/20 |
| 2021/0303939 A1* | 9/2021 | Hu | G06K 9/6293 |
| 2021/0312150 A1* | 10/2021 | Nater | G06K 7/1447 |
| 2021/0350376 A1* | 11/2021 | Rosenthal | G06Q 20/4016 |
| 2022/0012435 A1* | 1/2022 | Parrott | G06F 40/58 |
| 2022/0019734 A1* | 1/2022 | Kurma | G06F 16/5846 |
| 2022/0019834 A1* | 1/2022 | Taskalian | G06F 16/538 |
| 2022/0027652 A1* | 1/2022 | Bhaskar | G06V 30/40 |
| 2022/0069985 A1* | 3/2022 | Haensel | G06V 30/413 |

* cited by examiner

```
'AAAAF8CoACgAAAACAAAADAAAAAAG+ihk4SPaAAAACgAAAAA+AEQARQBT
AEsAVABPAFAALQA2AEkASABQAFQASwBRAC4AYwBvAGwAdQBtAGIAdQBz
AC4AcgByAC4AYwBvAG3AqAAjAAAAgAAAAwAAAAABlh6Yi+vGQAAAAoAA
AAAGAAxADkAMgAuADEANgA4AC4AMAAuADMANcCoACEAAAACAAAADA
AAAAAGuCfrDCPwAAAACgAAAAAYADEAOQAyAC4AMQA2ADgALgAwAC4A
MwAzwKgAHgAAAAIAAAAMAAAAAbcpjIrvdoAAAAKAAAAABgAMQA5ADIA
LgAxADYAOAAuADAALgAzADDAqAAdAAAAAgAAAAwAAAAABsge5ygexgAA
AAoAAAAAGAAxADkAMgAuADEANgA4AC4AMAAuADIAOcCoABwAAAACAA
AADAAAAAAG4E9DS7LCAAAACgAAAAAYADEAOQAyAC4AMQA2ADgALgAw
AC4AMgA4wKgAGwAAAAIAAAAMAAAAAZwgeshrp4AAAAKAAAAABgAMQ
A5ADIALgAxADYAOAAuADAALgAyADfAqAAaAAAAAgAAAAwAAAAABqDFia
MDkAAAAAoAAAAGAAxADkAMgAuADEANgA4AC4AMAAuADIANsCoABkA
AAACAAAADAAAAAAGZFKZA/
CCAAAACgAAAAAYADEAOQAyAC4AMQA2ADgALgAwAC4AMgA1wKgAGAAA
AAIAAAAMAAAAAb09dhyddwAAAAKAAAAABgAMQA5ADIALgAxADYAOAA
uADAALgAyADTAqAAXAAAAgAAAAwAAAAABrgn64MD4gAAAAoAAAAACg
BTAEkARABSAEHAqAAVAAAAgAAAAwAAAAABji6+J3W4AAAAAoAAAAAGA
AxADkAMgAuADEANgA4AC4AMAAuADIAMcCoABQAAAACAAAADAAAAAAG
0FKoYz63AAAACgAAAAAYADEAOQAyAC4AMQA2ADgALgAwAC4AMgAwwK
gAEwAAAAIAAAAMAAAAAYgFtgjXvlAAAAKAAAAAB4ARABFAFMASwBUAE
8AUAAtAFQAUABHADcARwBHADTAqAASAAAAgAAAAwAAAAABtzvyl7mjA
AAAAoAAAAAGAAxADkAMgAuADEANgA4AC4AMAAuADEAOMCoABAAAAA
CAAAADAAAAAAGRGEyrXAHAAAACgAAAAAYADEAOQAyAC4AMQA2ADgAL
gAwAC4AMQA2wKgADwAAAAIAAAAMAAAAAbkfb0/
7TUAAAAKAAAAABgAMQA5ADIALgAxADYAOAAuADAALgAxADXAqAAOAAA
AAgAAAAwAAAAABqAC3EENQgAAAAoAAAAAGAAxADkAMgAuADEANgA4A
C4AMAAuADEANMCoAA0AAAACAAAADAAAAAAGMM2nqrr7AAAACgAAAA
AeAFMARQBDDADMAMABDAEQAQQA3AEEAQQBCAEEARgBCwKgADAAAAAI
AAAAMAAAAAYAGGEPussAAAAKAAAAABgAMQA5ADIALgAxADYAOAAuAD
AALgAxADLAqAALAAAAAgAAAAwAAAAABsg6a9oRRgAAAAoAAAAAGAAxAD
kAMgAuADEANgA4AC4AMAAuADEAMcCoAAoAAAACAAAADAAAAAAGABh
N//
8HAAAACgAAAAAUAFIARQBBAEQAWQBTAEgAQQBSSAEXAqAABAAAAAgAA
AAwAAAAABggCjn+qcgAAAAoAAAAAFgAxADkAMgAuADEANgA4AC4AMAA
uADE='
```

Fig. 6

METHOD OF TRANSFERRING DATA BETWEEN UNCONNECTED COMPUTING DEVICES

CROSS-REFERENCE TO RELATED APPLICATIONS

This application claims priority to the U.S. provisional patent application Ser. No. filed 63/055,555, filed on Jul. 23, 2020 which is incorporated herein by reference in its entirety.

FIELD OF THE INVENTION

The present invention relates to a method of transferring data between computing devices, more particularly, the present invention relates to a method for transferring a chunk of data between unconnected computing devices.

BACKGROUND OF THE INVENTION

In a rapidly changing technological world, data are being generated every moment. Every interaction in the digital world typically involves sharing data. The data can be commands, instructions, and files. Two computing devices for sharing data should be connected. The two devices can connect through a wired or wireless connection. Only when the devices are connected, they can share the data. Data files can only transfer from one device to another when both the devices are connected. There are numerous ways available for connecting two devices.

However, such scenarios are not uncommon when two computing devices could not connect but data needs to be transferred between the devices or from one device to another. Such scenarios are quite common when two devices could not connect due to incompatibility between the two devices or restrictions imposed on any or both devices. For example, a device or network of devices can be isolated for security reasons. Typically, such devices may contain any classified or important data, and access to such devices can be restricted. This prevents any unauthorized access to steal or harm the data.

Any legit transferring of data from an isolated device or isolated network of the devices to any other device can be difficult. Thus, a need is appreciated for a method for transferring data from an isolated computing device or network of devices.

SUMMARY OF THE INVENTION

The principal object of the present invention is to transfer a chunk of data between unconnected computing devices.

It is an additional object of the present invention that the method is quick and easy.

It is still an additional object of the present invention that the method is not laborious.

It is a further object of the present invention that the data can be transferred without affecting the security of the computing devices.

It is yet another object of the present invention that the method is economical.

In one aspect, disclosed is a method of transferring a chunk of data between unconnected computing devices. The method includes capturing an image of the chunk of data present in the source computing device using an optical sensor, such as a camera. Receiving of the image by the target computing device, wherein the target computing device processes the image using an optical character recognition algorithm.

In one aspect, disclosed is a method of transferring a chunk of data between unconnected computing devices. The first chunk of data present in a source computing device can be in a format that is binary data or nonstandard characters. Encoding, by the source computing device, the first chunk of data to the second chunk of data. The second chunk of data is in a format that is of standard characters, such as text. Capturing an image of the second chunk of data by an optical sensor. Receiving of the image by the target computing device. Processing of the image, by the target computing device, to the second chunk of data. Decoding, by the target computing device, the secondary chunk of data to the first chunk of data.

For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The accompanying figures, which are incorporated herein, form part of the specification and illustrate embodiments of the present invention. Together with the description, the figures further explain the principles of the present invention and to enable a person skilled in the relevant arts to make and use the invention.

FIG. 6 shows an example of chunk of data, according to an exemplary embodiment of the present invention.

DETAIL DESCRIPTIONS OF THE INVENTION

Figure 1:
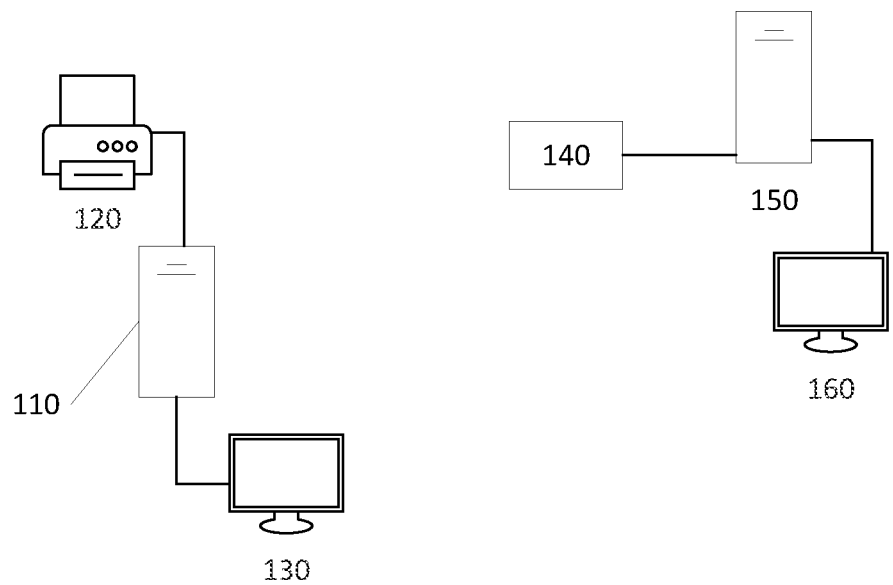
FIG. 1 is an environment diagram showing a source computing device and a target computing device.

Subject matter will now be described more fully hereinafter. Subject matter may, however, be embodied in a variety of different forms and, therefore, covered or claimed subject matter is intended to be construed as not being limited to any exemplary embodiments set forth herein; exemplary embodiments are provided merely to be illustrative. Likewise, the reasonably broad scope for claimed or covered subject matter is intended. Among other things, for example, the subject matter may be embodied as apparatus and methods of use thereof. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present invention" does not require that all embodiments of the invention include the discussed feature, advantage, or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description includes the best currently contemplated mode or modes of carrying out exemplary embodiments of the invention. The description is not to be taken in a limiting sense but is made merely for the purpose of illustrating the general principles of the invention since the scope of the invention will be best defined by the allowed claims of any resulting patent.

The following detailed description is described with reference to the drawings, wherein like reference numerals are used to refer to like elements throughout. In the following description, for purposes of explanation, specific details may be set forth in order to provide a thorough understanding of the subject innovation. It may be evident, however, that the claimed subject matter may be practiced without these specific details. In other instances, well-known structures and apparatus are shown in block diagram form in order to facilitate describing the subject innovation. Moreover, the drawings may not be to scale.

Disclosed is a method of transferring a chunk of data between two computing devices that are unconnected. The computing devices are unconnected, such that the two computing devices cannot share any data. Referring to FIG. 1 which is a block diagram showing the source computing device 110 and a target computing device 150. As can be seen in FIG. 1 that there is no wired or wireless connection between the source computing device 110 and the target computing device 150. The source computing device 110 can be connected to a printer 120 and a display 130. The printer can be optional. The target computing device 150 can be connected to an optical sensor 140 and a display 160. The optical sensor can be a sensor that can capture an image, for example, the optical sensor can be a camera, optical scanner, and like. It is to be understood that the display can be separate from the computing unit, for example, the display can be a monitor that is electrically connected to the computing unit. Additionally, the display can be integrated with the computing device, for example, a smartphone.

Figure 2:
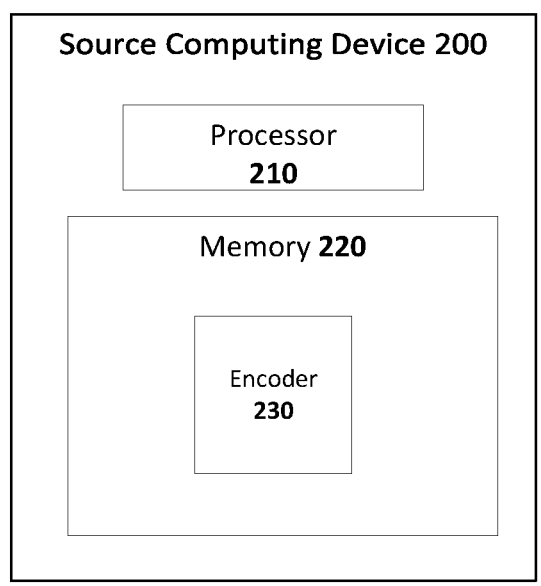
FIG. 2 is a block diagram showing the source computing device, according to an exemplary embodiment of the present invention.

Referring to FIG. 2 which is a block diagram showing the source computing device 200. The source computing device can include a processor 210 and a memory 220. The processor can be any logic circuitry that responds to and processes instructions fetched from the memory. The processor can be a microprocessor unit, e.g. Intel processors, Xeon processors, and AMD processor. The structure and functioning of the processors are known to a skilled person. The memory may include one or more memory chips capable of storing data and allowing any storage location to be directly accessed by the processor. The structure and functioning of the memory are known to a skilled person. As shown in FIG. 2, the memory includes an encoder 230 according to the present invention which, when executed by the processor 210 causes the processor 210 to perform one or more functions of the present invention. The source computing device 200 can include an operating system, such as platforms for mobile computing devices including Android, iOS, and windows, and the platforms for workstations, such as Unix, Windows, Mac operating systems.

Figure 3:
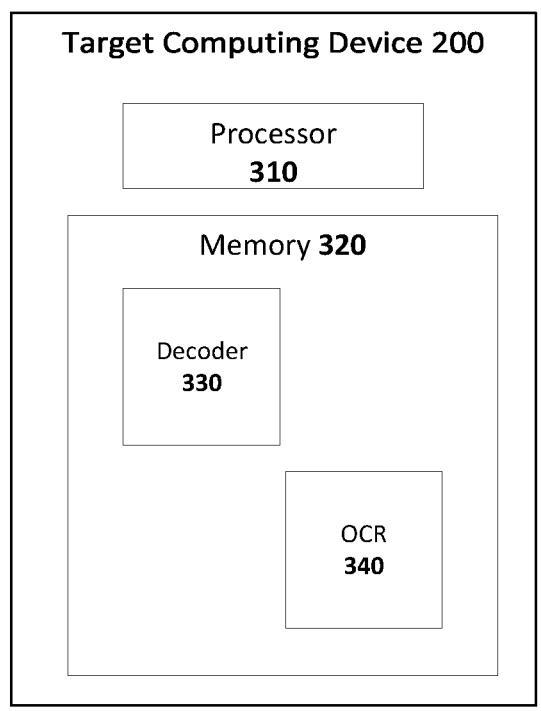
FIG. 3 is a block diagram showing the target computing device, according to an exemplary embodiment of the present invention.

Referring to FIG. 3 which is a block diagram showing the target computing device 300. The target computing device can include a processor 310 and a memory 320. The processor can be any logic circuitry that responds to and processes instructions fetched from the memory. The processor can be a microprocessor unit, e.g. Intel processors, Xeon processors, and AMD processor. The structure and functioning of the processors are known to a skilled person. The memory may include one or more memory chips capable of storing data and allowing any storage location to be directly accessed by the processor. The structure and functioning of the memory are known to a skilled person. As shown in FIG. 3, the memory includes a decoder 330 and an OCR package 340 according to the present invention which, when executed by the processor causes the processor to perform one or more functions of the present invention. The target computing device can include an operating system, such as platforms for mobile computing devices including Android, iOS, and windows, and the platforms for workstations, such as Unix, Windows, Mac OS.

The encoder 230 can transform human unreadable data into readable data. For example, data consisting of nonstandard characters are considered unreadable by humans. Binary data, audio, photographs, and like data cannot be read by humans. The human-readable data can consist of standard characters, for example, text can be read by humans. Standard characters can be based on ASCII standard or any similar standard for representing text in computing devices. The text can include alphanumeric characters and standard symbols. There are many encoding techniques available that encode the data to a serial string format. Examples of encoders include Python pickle library, Unix base64 binary, and Base64 library (python, java, and other languages). Once the data is converted to serial string format, it can be in a Human readable format based on ASCII standard. The decoder 330 can transform the encoded data by the encoder 230 to its original state. The decoder can use the same method/technique used by the encoder, and examples for decoder can also be based on Python pickle library, Unix base64 binary, and Base64 library (python, java, and other languages). The OCR 340 stands for optical character recognition, the functioning of the OCR is known in the art.

Figure 4:
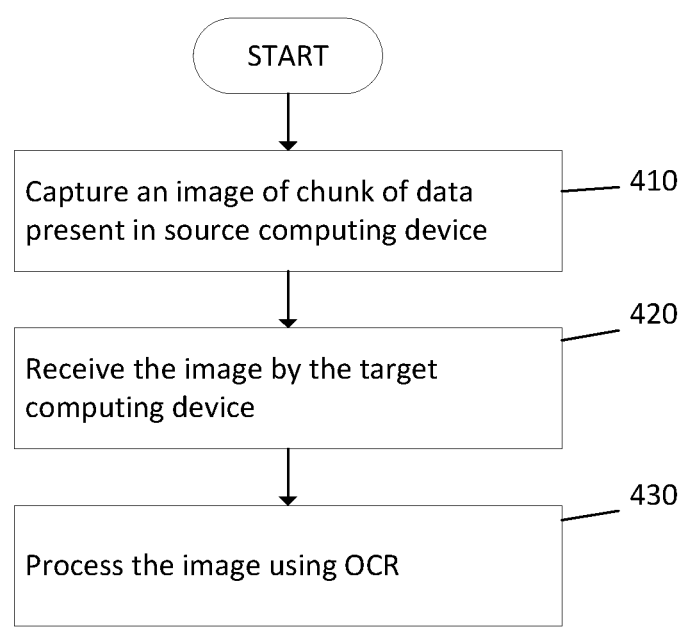
FIG. 4 is a flow chart showing one implementation of the disclosed method.

Now referring to FIG. 4, which shows one implementation of the disclosed method for transferring a chunk of data present in the source computing device to the target computing device. The chunk of data can be a text that is displayed on the display of the source computing device. An optical sensor, such as a camera can be used to capture an image of the text displayed on the display, at step 410. The image can then be received by the target computing device, at step 420. The optical sensor can be connected to the target computing device for transferring the image. The image can be processed by the target computing device using the OCR to retrieve the original chunk of data from the image.

Figure 5:
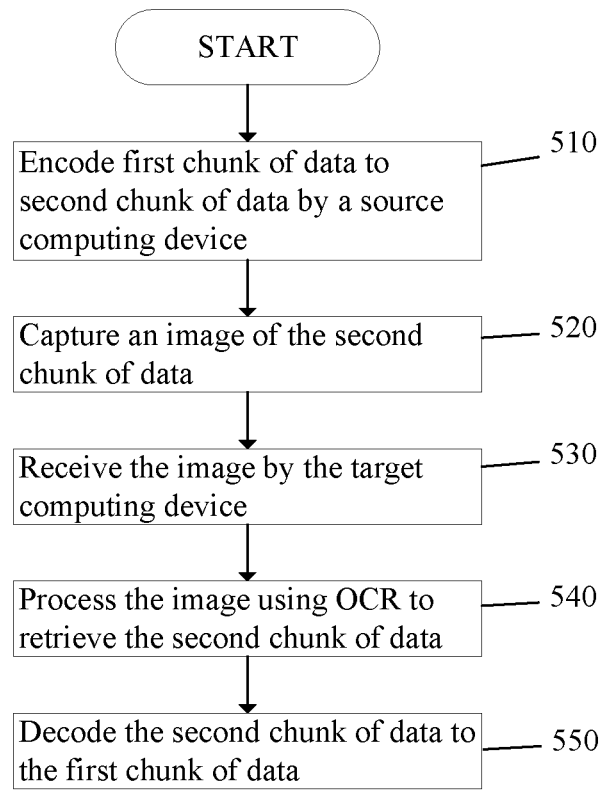
FIG. 5 a flow chart showing another implementation of the disclosed method.

FIG. 5 shows another implementation of the disclosed method for transferring a chunk of data present in the source computing device to the target computing device. The chunk of data can be the first chunk of data that is present in the source computing device. The first chunk of data can be in the form unreadable by humans or of non-standard characters. The first chunk of data can be encoded by the source computing device to the second chunk of data, at step 510. The second chunk of data can in a format that is readable by humans, for example, the second chunk of data can be text.

An exemplary embodiment of the second chunk of data is shown in FIG. 6. The second chunk of data can be displayed on a display connected to the source computing device. An optical scanner, such as a camera can be used to capture an image of the second chunk of data, at step 520. The image can then be received by the target computing device, at step 530. The optical sensor can be connected to the target computing device for transferring the image. The image can be processed by the target computing device using the OCR to retrieve the second chunk of data from the image, at step 540. The second chunk of the data can then be decoded to the first chunk of data using a suitable decoder, at step 550.

Example: A binary file "advanced_ip_scanner_MAC.bin" from the source computing device was transferred to the target computing device. First the binary file was encoded to serial string data representation using following commands:

```
#!/usr/bin/env python
import base64
filename = 'advanced_ip_scanner_MAC.bin'
Encode Data
with open (filename, 'rb') as f:
encoded_string = base64.b64encode(f.read( ))
print(encoded_string)
```

The output is a text as shown in FIG. 6. The output was captured as an image and transferred to the target computing device. On the target computing device, the image was processed using OCR and the serial string data was retrieved from the image. The serial string data was decoded to the original format using the following commands:

```
#!/usr/bin/env python
import base64
Decode Data
decoded_string = base64.b64decode(encoded_string)
restored_filename = 'advanced_ip_scanner_MAC_restored.bin'
with open(restored_filename, 'wb') as f:
f.write(decoded_string)
```

Thereafter sanity check was conducted in which the files in the source computing device and the target computing device were compared. Both the files were found to be identical.

```
$ls -al advanced_ip_scanner_MAC.bin
-rw-r--r-- 1 root root 1322 Feb 14 15:20 advanced_ip_scanner_MAC.bin
    $ls -al advanced_ip_scanner_MAC_restored.bin
-rw-r--r-- 1 root root 1322 Jun 29 18:22
advanced_ip_scanner_MAC_restored.bin
```

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

What is claimed is:

1. A method for transferring a chunk of data from a source computing device to a target computing device, the method comprising:

encoding, by the source computing device, a first chunk of data to a second chunk of data, the first chunk of data is of human-unreadable format and the second chunk of data is of human-readable format;

printing or displaying, by the source computing device, the second chunk of data;

capturing, by an optical sensor, an image of the second chunk of data;

receiving, by the target computing device, the image;

processing, by the target computing device, the image using OCR to retrieve the second chunk of data; and decoding, by the target computing device, the second chunk of data to the first chunk of data.

2. The method of claim 1, wherein the human-unreadable format is non-standard characters.

3. The method of claim 1, wherein the human unreadable format is binary format.

4. The method of claim 1, wherein the human readable format is text.

5. The method of claim 1, wherein the human readable format is of ASCII standard characters.

6. The method of claim 1, wherein the optical sensor is a camera and the second chunk of data is displayed on a display, the display connected to the source computing device.

\* \* \* \* \*